United States Patent
Cen et al.

(10) Patent No.: US 7,755,265 B2
(45) Date of Patent: Jul. 13, 2010

(54) LAMP BASE ASSEMBLY WITH ELECTRONIC BALLAST FOR ENERGY-SAVING LAMP

(75) Inventors: Lai Qian Cen, Guangzhou (CN); Chao Hong Du, Foshan (CN); Wolfgang Pabst, München (DE)

(73) Assignee: OSRAM Gesellschaft mit beschraenkter Haftung, Munich (DE)

( * ) Notice: Subject to any disclaimer, the term of this patent is extended or adjusted under 35 U.S.C. 154(b) by 473 days.

(21) Appl. No.: 11/661,979

(22) PCT Filed: Nov. 11, 2005

(86) PCT No.: PCT/EP2005/012121
§ 371 (c)(1), (2), (4) Date: Jun. 13, 2007

(87) PCT Pub. No.: WO2006/053687
PCT Pub. Date: May 26, 2006

(65) Prior Publication Data
US 2007/0253166 A1 Nov. 1, 2007

(30) Foreign Application Priority Data
Nov. 16, 2004 (CN) .................. 2004 1 0095741

(51) Int. Cl.
*H01J 5/48* (2006.01)
(52) U.S. Cl. .................... 313/318.01; 313/46
(58) Field of Classification Search ............ 313/46, 313/318.01–318.12
See application file for complete search history.

(56) References Cited

U.S. PATENT DOCUMENTS

| | | | |
|---|---|---|---|
| 4,444,944 A | | 4/1984 | Matsushita et al. |
| 4,503,358 A | * | 3/1985 | Kamei et al. .................. 315/58 |
| 6,140,751 A | | 10/2000 | Hammer et al. |
| 6,548,948 B1 | | 4/2003 | Muessli |
| 2003/0080691 A1 | | 5/2003 | Yasuda et al. |

FOREIGN PATENT DOCUMENTS

| | | |
|---|---|---|
| JP | 57 050762 | 7/1982 |
| WO | WO 96/13048 | 5/1996 |

* cited by examiner

*Primary Examiner*—Nimeshkumar D. Patel
*Assistant Examiner*—Christopher M Raabe

(57) ABSTRACT

A lamp base assembly with electronic ballast for energy-saving lamp includes a housing (22), a lamp cap (21) and an electronic ballast (24) with transistors (23) provided within the housing. A transistor heat-diffusing element surrounding each transistor is provided within the lamp base, for enhancing the heat transfer from the transistors to the housing or the lamp cap, so that the heat generated from the transistors could be transferred out of the lamp base assembly. Thus, the heat-diffusing ability of the transistors is improved, and the working temperature of the transistors could be kept within a safe scope, so that the lifetime of the energy-saving lamp is guaranteed.

2 Claims, 6 Drawing Sheets

Figure 2
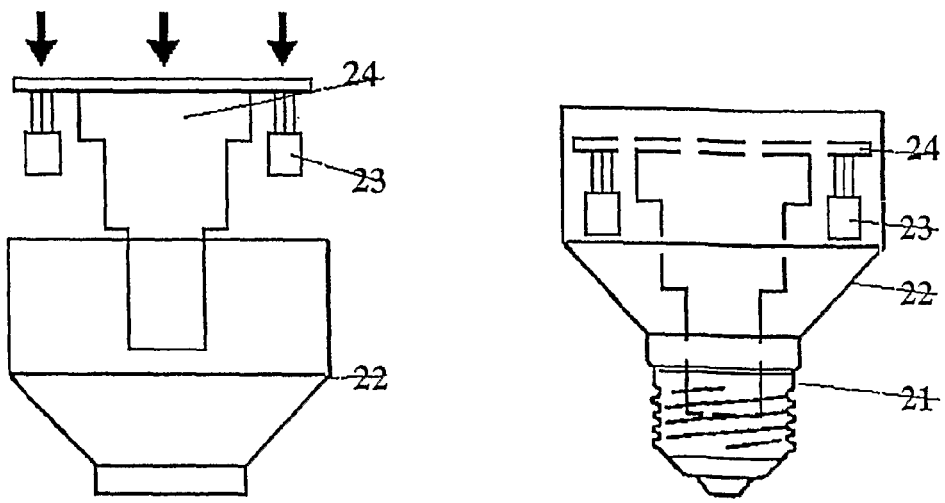
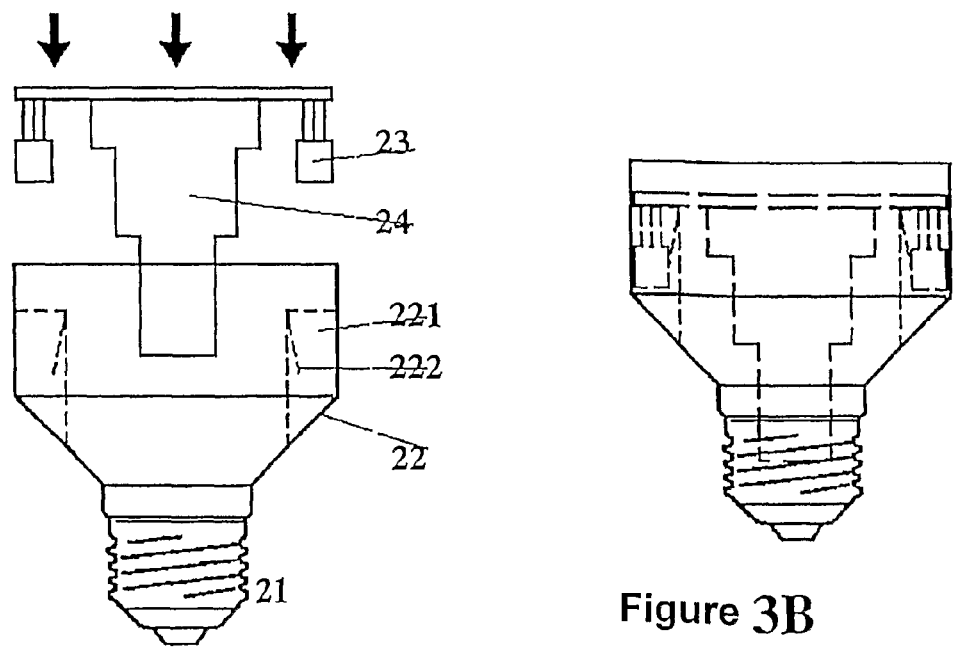
Figure 3A
Figure 3B

Figure 5A
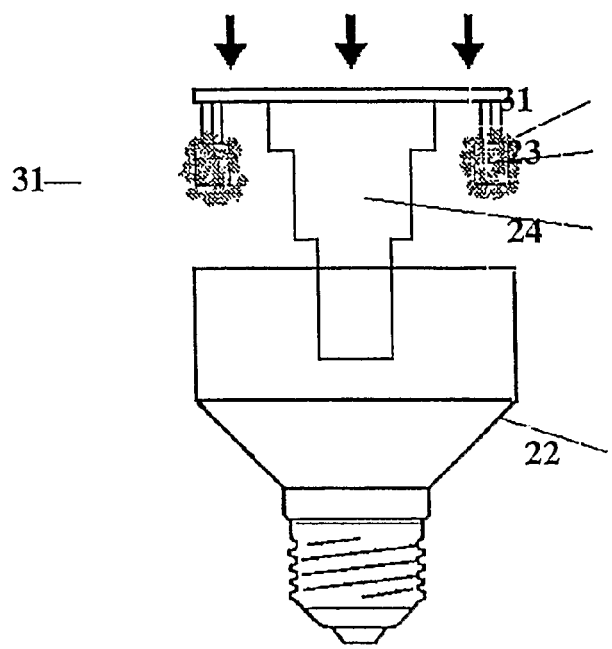
Figure 5B
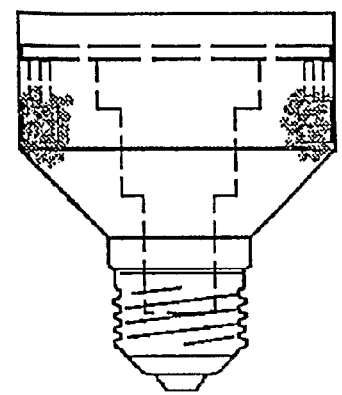
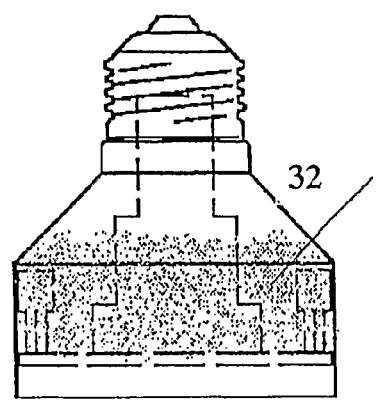
Figure 6

Figure 7A
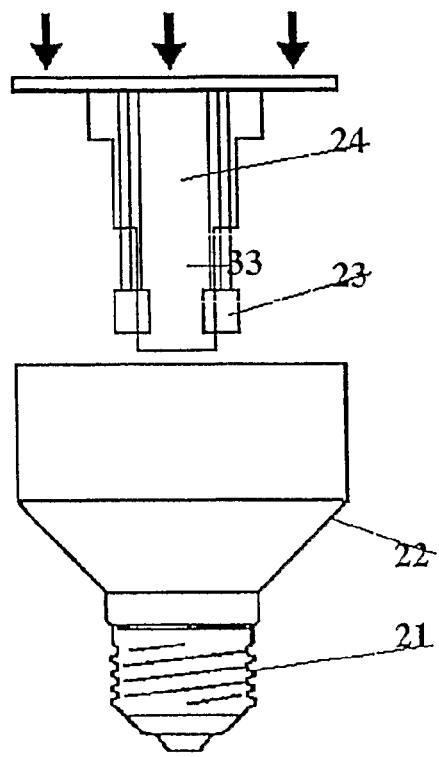
Figure 7B
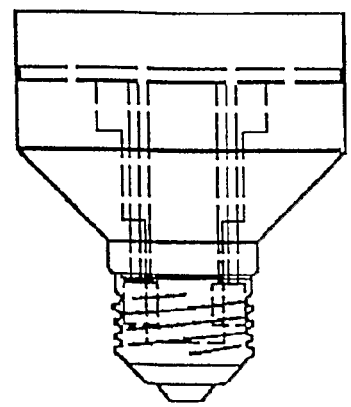
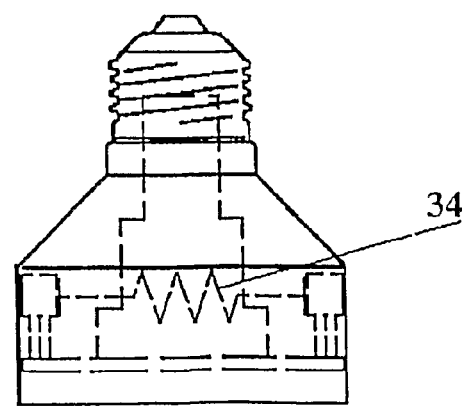
Figure 8

LAMP BASE ASSEMBLY WITH ELECTRONIC BALLAST FOR ENERGY-SAVING LAMP

TECHNICAL FIELD

The invention relates to energy-saving lamp, in particularly to the lamp base assembly with electronic ballast for energy-saving lamp (hereafter referred as "lamp base assembly").

TECHNICAL BACKGROUND

Energy-saving lamp is also called compact fluorescent lamp, the advantages of which are high lumen efficiency, low power consumption, long useful life and compact structure, etc., thereby it has been widely used. As shown in FIG. 1, a normal energy-saving lamp comprises a burner 1 and a lamp base assembly 2, wherein the burner 1 is mounted on the lamp base assembly 2, and electrically connects with the lamp base assembly 2 by a leaf spring 11. The lamp base assembly 2 includes a housing 22, a lamp cap 21 mounted on one end of the housing 22, and an electronic ballast 24 mounted within the housing 22. The circuits of the electronic ballast are commonly used in the form of saturated magnetic toroid (current drive) circuit, MOSFET circuit, and voltage drive circuit with bipolar transistor (no magnetic toroid). In the above three kinds of circuits, the first two circuits are of high cost. Therefore, in the low-cost electronic energy-saving lamp, the voltage drive circuit with bipolar transistor, in which one or more bipolar transistor 23 are contained (hereafter referred as transistors 23), is usually used. However, one disadvantage is, within the desired scope of supply voltage and operating temperature of the energy-saving lamp, the temperature of the transistors can not be kept within a safe scope; as a result, the lifetime of the whole energy-saving lamp will be shortened. Therefore, lowering the temperature of the transistors becomes a problem to be solved in the prior art.

SUMMARY

The aim of the invention is to provide a lamp base assembly which could lower the transistor temperature, and an energy-saving lamp containing the same.

The aim of the invention is achieved by a lamp base assembly which comprises a housing, a lamp cap mounted on one end of the housing and an electronic ballast with transistors provided within the housing, characterized in that a transistor heat-diffusing structure surrounding each transistor is provided within the lamp base for enhancing the heat transfer from the transistors to the housing or the lamp cap, so that the heat generated from the transistors could be transferred out of the lamp base assembly.

According to a preferred embodiment of the invention, cavities for respectively receiving one of the transistors are arranged in the inner side of the housing, the positions of the cavities corresponding to those of the transistors, and one end of each cavity is open to receive one of the transistors, the other end of each cavity is narrowed or sealed to prevent the transistors escaping. A leaf spring is provided in each cavity. One end of the spring is fixed to the inner wall of the cavity, and the other free end may press the transistors onto the housing when assembling. With this structure, when the transistors are inserted into their own cavities, they are pressed onto the housing by the free end of the leaf springs, forming a close contacting. Because the temperature of housing is much lower then that of the transistors in operation, the heat generated from the transistors can be transferred to the housing when operation, and then be further transferred through the housing to the atmosphere. Moreover, the transistors are located inside the cavities during operation, thereby separated from other components of the lamp that may also generate heat. The heat generated by these components is not easily transferred to the surrounding of the transistors. In this way, during operation, the transistors will not be influenced by those possibly existing heat sources, so that the surrounding temperature of the transistors may also become lower. Thus, the heat-diffusing ability of the transistors is improved, and will not be influenced by other possibly existing heat sources. Hence, the working temperature of the transistors could be kept within a safe scope, so that the lifetime of the energy-saving lamp is guaranteed.

According to a preferred embodiment of the invention, silicon gel is coated around the transistors and is kept contacting with the housing.

According to a preferred embodiment of the invention, heat-diffusing material is filled with the whole electronic ballast.

According to a preferred embodiment of the invention, the transistors are arranged at the low end of the electronic ballast, and inserted into the inner space of the lamp base during assembling.

According to a preferred embodiment of the invention, a leaf spring is provided inside the housing and located between the transistors, and exert a spring force outwardly so as to press the transistors onto the inner surface of the housing.

According to a preferred embodiment of the invention, a metal heat-diissuing piece is provided on the transistors.

BRIEF DESCRIPTION OF THE DRAWINGS

The purposes and its advantages of the invention will be apparent from the following description in combination with the drawings, in which like numbers are used to indicate like elements throughout. In the drawings:

FIG. 2 is the assembling schematic diagram of the lamp base assembly of the energy-saving lamp of the prior art, FIGS. 3A and 3B are the diagrams of the lamp base assembly of the first embodiment according to the invention, which show respectively the state before and after the assembling of the lamp base assembly.

FIGS. 5A and 5B are the diagrams of the lamp base assembly of the second embodiment according to the invention, which show respectively the state before and after the assembling of the lamp base assembly, FIG. 6 is the diagram of the lamp base assembly of the third embodiment according to the invention, which shows the state after the assembling of the lamp base assembly, FIGS. 7A and 7B are the diagrams of the lamp base assembly of the fourth embodiment according to the invention, which show respectively the state before and after the assembling of the lamp base assembly, FIG. 8 is the diagram of the lamp base assembly of the fifth embodiment according to the invention, which shows the state after the assembling of the lamp base assembly.

DETAILED DESCRIPTION OF THE PREFERRED EMBODIMENTS

Figure 1:
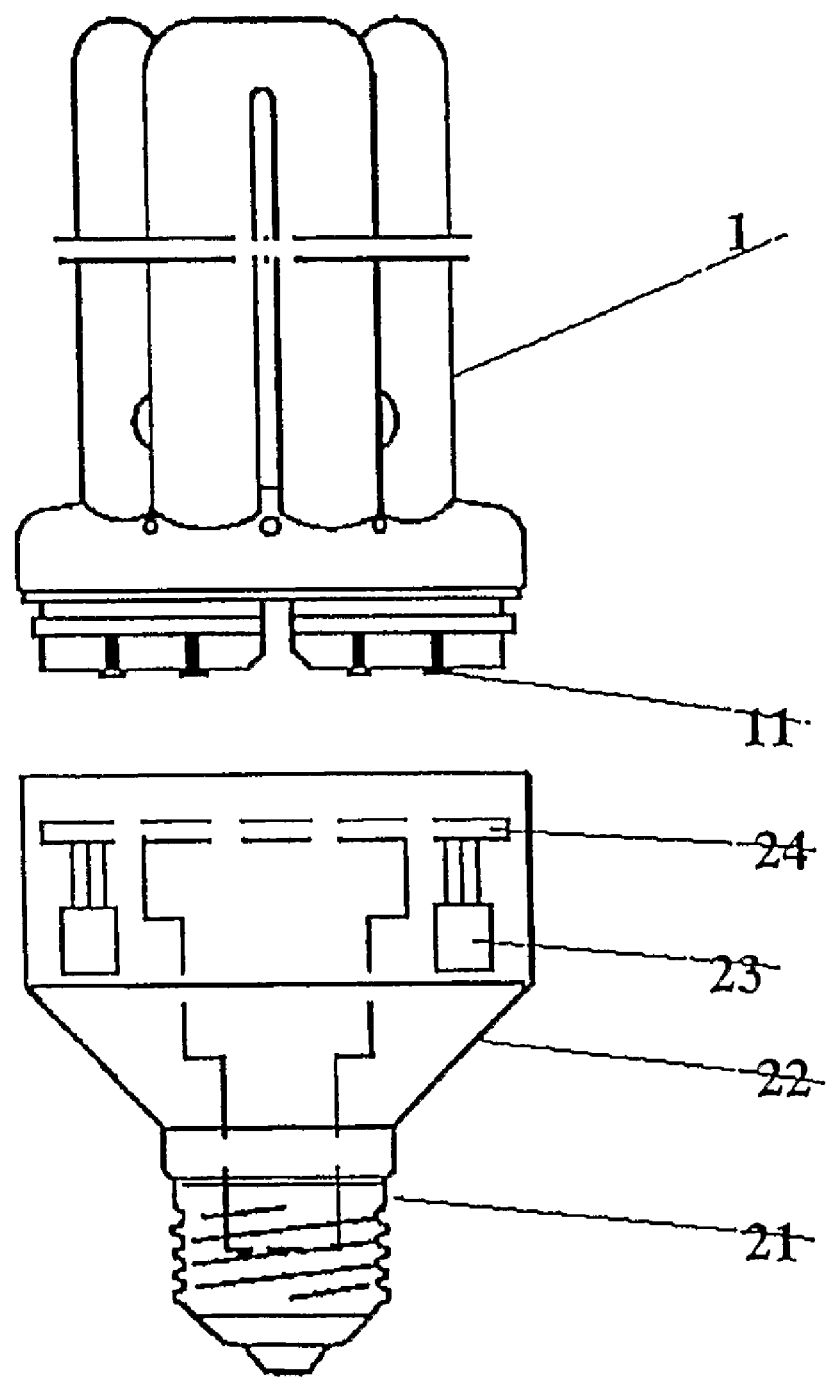
FIG. 1 is the structural schematic diagram of the energy-saving lamp of the prior art.

FIG. 1 and FIG. 2 are mentioned above, wherein FIG. 1 is the structural view of the energy-saving lamp of the prior art, and FIG. 2 is the assembling view of the lamp base assembly of the energy-saving lamp of the prior art.

Figure 4:
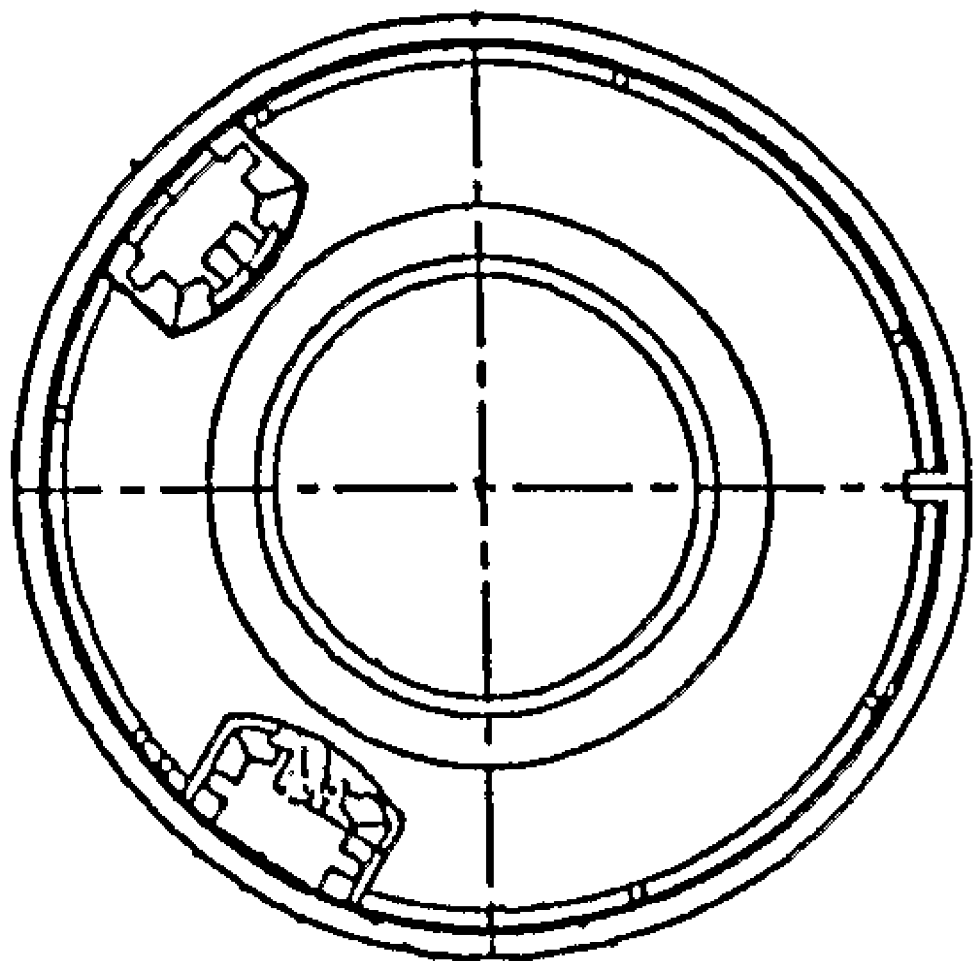
FIG. 4 is the top view of the housing of the lamp base assembly of the first embodiment according to the invention, which shows the positions of two cavities for receiving transistors.

Referring to FIGS. 3A, 3B and FIG. 4, in which show the structure and the assembling arrangement of the lamp base assembly according to the first embodiment of the invention.

As shown in FIG. 3A, the energy-saving lamp of the invention comprises a burner (not shown) and an improved lamp base assembly 2. The lamp base assembly 2 comprises a housing 22. On one end of the housing 22 is mounted with a lamp cap 21, which is a screw cap in this example, but can be also other types generally used in this art. An electronic ballast 24 is arranged inside the housing 22, and adopts a voltage drive circuit with bipolar transistors without magnetic toroid, in which the transistors are marked with reference number 23. For conveniently illustrating, this description adopts the electronic ballast with two transistors 23 to be explained. However, one skilled in this art could understand that the number of the quantity of the transistors could be appropriately chosen based on the particular need. Within the inside of the housing are provided with cavities 221, each receiving one of the transistors and having a position corresponding that of the transistor 23 received therein; for example, the cavities can be arranged as shown in FIG. 3, or arranged as shown in FIG. 4, i.e., asymmetry to the central axis of the cross-section of the lamp base. The cavities 221 are generally annular, one ends of which are open, and are sized to receive the transistors 23. The open ends may be made with certain inclination, in order to facilitate the insertion of the transistors 23. The other ends of the cavities 221 are narrowed or sealed, to prevent the escaping of the transistors from the cavities. A leaf spring 222 is arranged inside each cavity 221, one end of which is fixed to the position near the top of the lamp base center of the annular inner wall of the cavities 221, the other end of which is a free end, extending downwards toward the outer wall of the housing with respect to the fixed end. During assembling, the transistors 23 are aligned with the cavities 221, then the electronic ballast 24 is fit into the housing 22. After assembling, as shown in FIG. 3B, the transistors 23 are placed inside the cavities 221 and are pressed onto the inner surface of the housing 22 by the effect of the springs 222, so that form close contact.

With this structure, when putting the transistors 23 into the housing 22, the transistors 23 are pressed onto the housing 22 by the free end of the springs 222 to form close contact. Since the temperature of the housing 22 is far lower than that of the transistors 23 during operation, the heat generated from the transistors 23 could be transferred to the housing 22, and further transferred through the housing 22 to the atmosphere. Moreover, during operation, the transistors 23 are located within the cavities, so that they depart from those components of the lamp possibly generating heat. The heat generated by those components will not be easily transferred to the nearby of the transistors 23. Thus, during working, the transistors 23 will not be influenced by those possibly existing heat sources; as a result, the configuration reduces the surrounding temperature of the transistors 23. The heat-diffusing ability of the transistors 23 is improved, and the influence of other possibly existing heat sources on the transistors is also lowered. In this way, the working temperature of transistors may be kept within the safe scope, and maintains the lifetime of the energy-saving lamp.

The following is by experiment data to show the advantages of the invention. The experiment is based on three kinds of lamps, that is, an energy-saving lamp A of prior art adopting saturated magnetic toroid (costly), an energy-saving lamp B of prior art adopting voltage drive circuit with bipolar transistors, and the energy-saving lamp adopting voltage drive circuit with bipolar transistors and the lamp base assembly of the invention simultaneously. The temperature of the transistors is measured under the conditions of same supply voltage (220V) and different ambient temperatures, or same ambient temperature (45° C.) and different supply voltages respectively. The rated power of all lamp is 20 W (supply voltage 220V, ambient temperature 25° C.). In order to obtain the steady temperature, all data is measured after 2 hours when operating conditions are changes each time. The results are shown in Table 1 and Table 2.

TABLE 1

Temperature of the transistors for the three kinds of lamps (supply voltage 220 V)

| | Ambient temperature (° C.) | Temperature of transistors T1 (° C.) | Temperature of transistors T2 (° C.) | Average temperature of transistors (° C.) |
|---|---|---|---|---|
| Lamp A | 25 | 88.6 | 83.3 | 86.0 |
| | 45 | 103.5 | 107.9 | 105.7 |
| | 65 | 129.7 | 131.5 | 130.6 |
| Lamp B | 25 | 97.2 | 95.9 | 96.6 |
| | 45 | 116.2 | 115.3 | 115.8 |
| | 65 | 141.6 | 141.0 | 141.3 |
| Lamp C | 25 | 79.8 | 78.6 | 79.2 |
| | 45 | 106.2 | 101.9 | 104.1 |
| | 65 | 132.6 | 127.5 | 130.1 |

Experiment 1 is carried out to measure the temperature of the transistors under the condition that the supply voltage is 220V all and the environment temperatures are 25° C., 45° C. and 65° C., respectively. As shown in Table 1, under the three different ambient temperatures, comparing with the lamp adopting the same voltage drive circuit with bipolar transistors buy not adopting the structure of the invention, the temperature of the transistors of the lamp of the invention is substantially lowed (in average lower 12%), and comparing with the lamp adopting the costly saturated magnetic toroid circuit, the temperature of the transistors of the lamp of the invention is roughly same (at 45° C. and 65° C.), even much lower (at 25° C.). Therefore, the structure of the invention can effectively lower the temperature of the transistors.

TABLE 2

Temperature of the transistors of the three kinds of lamps (ambient temperature 45° C.)

| | Supply voltage (V) | Temperature of transistors T1 (° C.) | Temperature of transistors T2 (° C.) | Average temperature of the transistors (° C.) |
|---|---|---|---|---|
| Lamp A | 220 | 103.5 | 107.9 | 105.7 |
| | 242 | 118.1 | 121.9 | 120.0 |
| Lamp B | 220 | 116.2 | 115.3 | 115.8 |
| | 242 | 152.5 | 151.1 | 151.8 |
| Lamp C | 220 | 106.2 | 101.9 | 104.1 |
| | 242 | 130.6 | 128 | 129.3 |

Experiment 2 is carried out to measure the temperature of the transistors under the condition that the ambient temperature is 45° C. and the supply voltage is respectively 220V and 242V. As shown in Table 2, on the condition of the two different supply voltages, comparing with the lamp adopting voltage drive circuit with bipolar transistors but not adopting the structure of the invention, the temperature of the transistors of the lamp of the invention is substantially much lower (in average lower 12.4%), and comparing with the lamp adopting costly saturated magnetic toroid circuit, the temperature of the transistors of the lamp of the invention is roughly same, or only slightly higher. Hence, adopting the structure of the invention can effectively lower the temperature of the transistors.

FIGS. 5A and 5B show the lamp base assembly of the second embodiment according to the invention. In this example, during assembling, silicon gel 31 is adhered to the surroundings of the transistors 23. After assembling, the silicon gel 31 contacts the inner surface of the housing, as shown in FIG. 5B. During lamp operation, silicon gel 31 tightly surrounds the transistors 23, and functions as the cavities receiving the transistors in FIG. 3. Thus, the heat generated by the transistors 23 may be diffused to the housing, and then transferred to the atmosphere through the housing. Therefore, this embodiment can also effectively lower the temperature of the transistors, and eventually maintains the lifetime of the lamp.

FIG. 6 shows the lamp base assembly of the third embodiment of the invention. Like the second embodiment in FIG. 5, in this example, certain amount of potting material, such as bitumen, silicon gel, etc. are filled within the whole housing 22. Just like the second embodiment, these potting materials can also effectively transfer the heat, so as to lower the temperature of the transistors, even lower that of the whole electronic ballast.

FIGS. 7A and 7B show the lamp base assembly of the forth embodiment according to the invention. In this example, by means of extending portions 33 integrally formed, the transistors 23 are arranged at the lower end of the electronic ballast 24, that is, the end near the lamp cap 21. After placing the electronic ballast 24 into the housing 22, the lower ends of the transistors will extend to the inner space of the lamp cap 21, as shown in FIG. 7B. In this way, during the period of lamp working, since the temperature in lamp cap is comparatively lower, the heat generated from the transistors will be transferred to the lamp cap, and then be discharged to the outside through the lamp cap. It could also effectively lower the temperature of the transistors.

FIG. 8 shows the lamp base assembly of the fifth embodiment according to the invention. A leaf spring 34 with special configuration is adopted in this example. The spring 34 is placed between the two transistors 23,23, and is constructed to exert an outward spring force to the transistors 23. Thus, after it is assembled into the housing 22, the transistors 23 are pressed onto the inner surface of the housing by the force of the spring 34. Therefore, just like the first embodiment, the embodiment could also effectively lower the temperature of the transistors, so as to maintain the lifetime of the whole energy-saving lamp.

Figure 9:
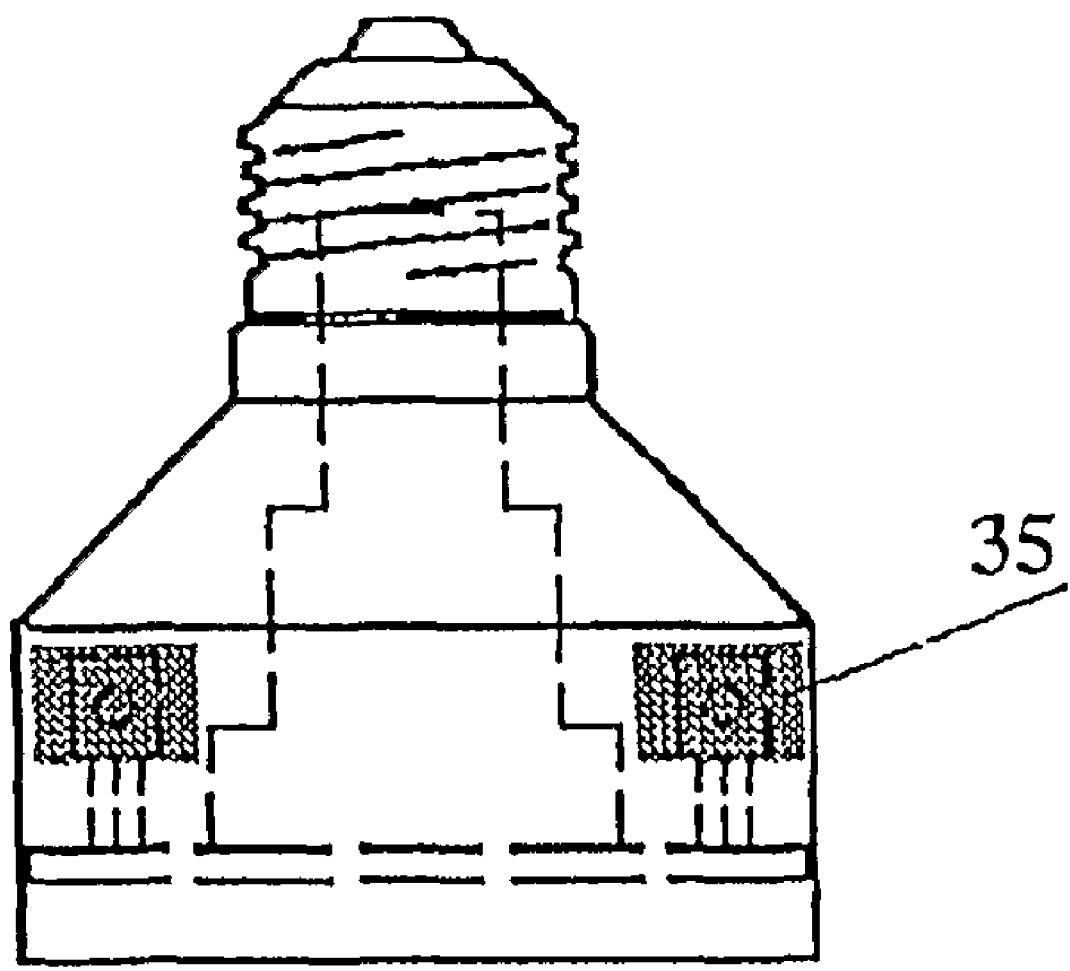
FIG. 9 is the diagram of the lamp base assembly of the sixth embodiment according to the invention, which shows the state after the assembling of the lamp base assembly.

FIG. 9 shows the lamp base assembly of the sixth embodiment according to the invention. Like the second embodiment, in this example, the outer surfaces of the transistors are arranged with metal heat-diffusing piece 35. Similarly, the metal heat-diffusing piece 35 could transfer the heat generated by the transistors to the outside, so as to lower the temperature of the transistors.

While some particular embodiments of the invention has illustrated and described in above description, one skilled in the art should understand that these embodiments are to be considered as illustrative and not restrictive in character. Without departing from the spirit and scope of the invention, it is allowed to make various modification or alteration to this invention.

The invention claimed is:

1. A lamp base assembly with ballast for energy-saving lamp, comprises housing, lamp cap mounted on one end of the housing, electronic ballast with transistors provided within the housing, transistor heat-diffusing means surrounding transistors is provided within the lamp base, for enhancing the heat transfer from the transistors to the housing or the lamp cap, so that the heat generated from the transistors could be transferred out of the lamp base assembly wherein the transistor heat-diffusing means comprise cavities for receiving transistors and leaf springs, the cavities arranged on the inner side of the housing, the positions of the cavities corresponding to those of the transistors, one end namely upper end of each cavity having opening for receiving the transistors, the other end namely lower end being narrowed or sealed for preventing the transistors from escaping, one end of each spring fixing to the inner wall of one cavity, the other free end pressing the transistors onto the housing during assembling.

2. An energy-saving lamp comprising the lamp base assembly according to claim 1.

\* \* \* \* \*